United States Patent [19]

Ikeuchi et al.

[11] Patent Number: 5,271,268

[45] Date of Patent: Dec. 21, 1993

[54] IONIC CURRENT SENSING APPARATUS

[75] Inventors: Masayuki Ikeuchi; Shigemi Murata; Toshio Iwata; Atsushi Ueda; Toshio Ohsawa, all of Himeji, Japan

[73] Assignee: Mitsubishi Denki Kabushiki Kaisha, Tokyo, Japan

[21] Appl. No.: 795,463

[22] Filed: Nov. 21, 1991

[30] Foreign Application Priority Data

| Nov. 26, 1990 | [JP] | Japan | 2-324246 |
| Nov. 27, 1990 | [JP] | Japan | 2-321168 |
| Nov. 30, 1990 | [JP] | Japan | 2-330473 |

[51] Int. Cl.$^5$ .............. F02D 1/00; F02P 9/00
[52] U.S. Cl. .................................. 73/115; 73/35; 324/460; 324/393
[58] Field of Search ........ 73/35 I, 115; 123/644, 123/650, 636, 425; 324/380, 391, 460, 393

[56] References Cited

U.S. PATENT DOCUMENTS

| 4,351,310 | 9/1982 | Adler | 123/644 |
| 4,359,893 | 11/1982 | Kizler | 73/35 I |
| 4,491,110 | 1/1985 | Bone | 73/35 I |
| 4,515,132 | 5/1985 | Anderson | 73/35 I |
| 4,762,106 | 8/1988 | Blauhut | |
| 4,774,925 | 10/1988 | Iwata | 123/644 |
| 4,915,086 | 4/1990 | Ciliberto | 123/644 |

FOREIGN PATENT DOCUMENTS

| 0384436 | 8/1990 | European Pat. Off. | 123/644 |
| 2330875 | 6/1977 | France | 123/644 |
| 2-301672 | 12/1990 | Japan | |

*Primary Examiner*—Kenneth A. Wieder
*Assistant Examiner*—Jose M. Solis
*Attorney, Agent, or Firm*—Sughrue, Mion, Zinn, Macpeak & Seas

[57] ABSTRACT

A capacitor is connected to an ignition coil for an internal combustion engine so as to be charged by ignition current generated by the ignition coil. After firing of a spark plug in a cylinder by the ignition current, the voltage across the capacitor is applied between the center electrode and the ground electrode of the spark plug to induce an ionic current between the electrodes. The resulting ionic current is measured by a current sensor connected to the capacitor.

11 Claims, 7 Drawing Sheets

IONIC CURRENT SENSING APPARATUS

BACKGROUND OF THE INVENTION

This invention relates to an apparatus for sensing ionic current flowing between the electrodes of a spark plug in an internal combustion engine.

In a spark ignited internal combustion engine, at the time of combustion in a cylinder of the engine, ionization takes place in the cylinder. If a voltage is applied between the electrodes of the spark plug for the cylinder, an ionic current is generated between the electrodes. By measuring the ionic current, it is possible to determine whether the cylinder in which the spark plug is disposed misfired based on the magnitude of the ionic current. Furthermore, the magnitude of the ionic current during the combustion stroke of a cylinder is highest when the pressure in the cylinder reaches a maximum, so the ionic current can be used to monitor pressure variations within a cylinder.

Conventional ionic current sensing devices have a power supply connected to a spark plug so as to apply a voltage between the center electrode and the ground electrode of the spark plug to produce an ionic current in the form of positive ions. An electric current flowing due to the ionic current through a current sensing resistor connected in series with the power supply is then measured as an indication of the ionic current. The power supply typically generates a voltage of approximately 50-300 volts. Such a voltage is usually produced by increasing a battery voltage using a DC-DC converter or the like. However, a DC-DC converter requires a transformer, so the power supply and the ionic current sensing apparatus as a whole ends up being large, heavy, and expensive.

SUMMARY OF THE INVENTION

Accordingly, it is an object of the present invention to provide an ionic current sensing apparatus for an internal combustion engine which is smaller, lighter, and less expensive than conventional ionic current sensing apparatuses.

It is another object of the present invention to provide an ionic current sensing apparatus that can be easily applied to a conventional ignition system for an internal combustion engine.

In an ionic current sensing apparatus according to the present invention, a high voltage generated in an ignition coil at the time of firing a spark plug of an engine is applied to an energy storage element in the form of a capacitor. After the spark plug is fired, the capacitor applies a voltage between the center electrode and the ground electrode of the spark plug. The voltage applied by the capacitor generates an ionic current between the electrodes of the spark plug, and the ionic current causes the capacitor to discharge. The current produced by the discharge of the capacitor is measured by a current sensor connected to the capacitor as an indication of the ionic current.

The voltage applied between the electrodes of the spark plug by the capacitor can be either a positive or a negative voltage. However, preferably the capacitor applies a positive voltage between the center electrode and the ground electrode of a spark plug.

The present invention can be applied to various types of ignition systems. For example, the ignition system can be with or without a distributor and with or without breaker points.

DESCRIPTION OF THE PREFERRED EMBODIMENTS

Figure 1:
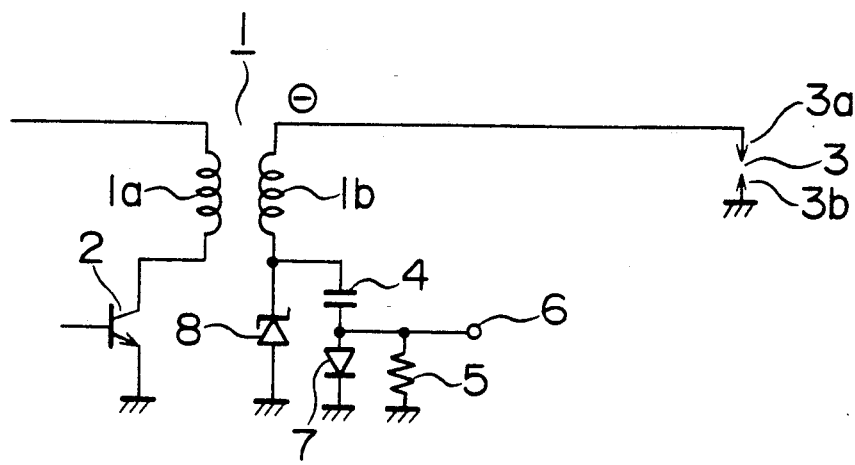
FIG. 1 is a circuit diagram of a first embodiment of an ionic current sensing apparatus according to the present invention.
Figure 2:
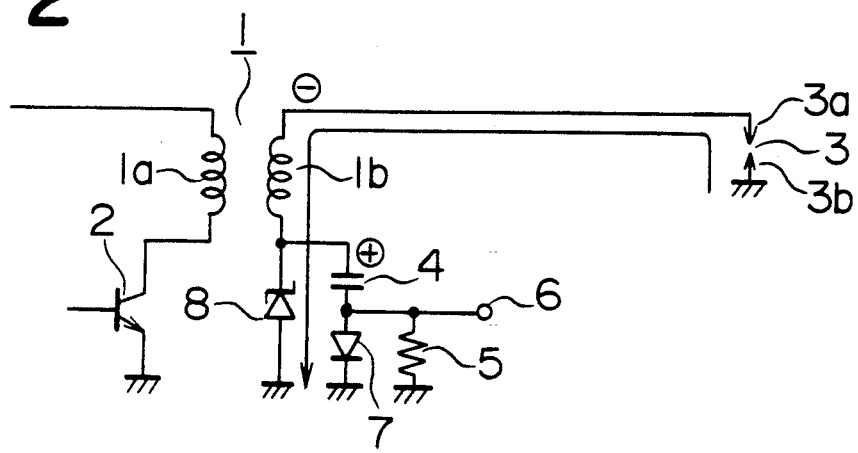
FIG. 2 is a circuit diagram of the embodiment of FIG. 1, showing the path of current when the spark plug is firing.
Figure 3:
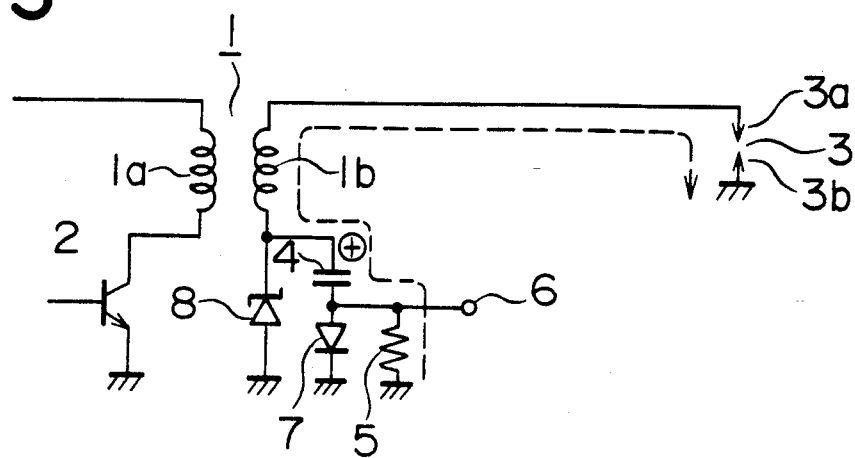
FIG. 3 is a circuit diagram of the embodiment of FIG. 1, showing the path of current when ionic current is flowing between the electrodes of the spark plug.

A number of preferred embodiments of an ionic current sensing apparatus according to the present invention will now be described while referring to the accompanying drawings. FIGS. 1-3 illustrate a first embodiment as applied to a conventional ignition system for an unillustrated multi-cylinder internal combustion engine. Although the engine has a plurality of cylinders, the ignition system for only one cylinder is illustrated. The ignition system includes a conventional ignition coil 1 having a primary winding 1a and a secondary winding 1b. One end of the primary winding 1a is connected to an unillustrated power supply, such as a battery, while the other end is connected to a switching device for controlling the flow of current through the primary winding 1a. The switching device in this embodiment is a power transistor 2 having its collector connected to the primary winding 1a and its emitter grounded. It is possible to employ a different type of switching device, such as the mechanical breaker points of a distributor. The switching of the power transistor 2 is controlled by a conventional, unillustrated control unit which applies a control signal to the base of the transistor 2. In this embodiment, a separate ignition coil 1 is provided for each cylinder of the engine, but it is possible for a single ignition coil 1 to be used for a plurality of the cylinders.

The secondary winding 1b has a positive end and a negative end. The engine has a plurality of spark plugs 3, each of which has a center electrode 3a connected to the negative end of the secondary winding 1b and a ground electrode 3b which is grounded.

The positive end of the secondary winding 1b is connected to one terminal of an energy storage element in the form of a capacitor 4. The other terminal of the capacitor 4 is connected to ground through a current sensor comprising a current sensing resistor 5. A terminal 6 is connected to the junction of the capacitor 4 and the resistor 5 to enable measurement of the change in the voltage across the resistor 5 due to ionic current flowing between the electrodes of the spark plugs 3. A rectifying element such as a diode 7 is connected in parallel with the resistor 5 with its anode connected to the capacitor 4 and its cathode connected to ground. A Zener diode 8 for clipping the voltage across the capacitor 4 and the diode 7 is connected in parallel with the capacitor 4 and the diode 7 such that its cathode is connected to the positive end of the secondary winding 1b and its anode is connected to ground. The Zener diode 8 is selected so as to charge the capacitor 4 to a prescribed voltage when the secondary winding 1b is energized. A typical value of the voltage across the capacitor 4 at this time is 300 volts.

When the cylinder in which the spark plug 3 is installed is to be ignited, the power transistor 2 is turned off by the unillustrated control unit to cut off the current flowing through the primary winding 1a, and a high voltage (generally 10–25 kV) having the polarity illustrated in FIG. 2 is generated in the secondary winding 1b. This voltage causes the spark plug 3 to discharge, and a discharge current flows from the spark plug 3 along the path shown by the arrow in FIG. 2. The discharge of the spark plug 3 ignites the fuel-air mixture in the corresponding cylinder, and combustion takes place. At the same time, the capacitor 4 is charged with the illustrated polarity to a voltage determined by the reverse breakdown voltage of the Zener diode 8.

Ionization is produced in the cylinder at the time of combustion of the fuel-air mixture, and ions are generated between the electrodes of the spark plug 3. At this time, the voltage across the capacitor 4 is applied to the electrodes of the spark plug 3, and this voltage causes an ionic current to flow between the electrodes. Due to the ionic current, the capacitor 4 discharges, and a current flows through the resistor 5, the capacitor 4, and the secondary winding 1b in the direction shown by the dashed arrow in FIG. 3. This current produces a change in the voltage at the terminal 6 corresponding to the magnitude of the ionic current. Therefore, by monitoring the voltage at the terminal 6, it can be ascertained whether the cylinder is firing properly.

If the voltage at the terminal 6 indicates that the cylinder is misfiring, then the engine can be controlled to let the misfiring cylinder rest. For example, the fuel supply to the misfiring cylinder can be cut off, thereby preventing uncombusted fuel from being discharged from the engine.

Preferably, the capacitor 4 is electrically connected to the spark plug 3 so that the capacitor 4 applies a positive voltage between the center electrode 3a and the ground electrode 3b of the spark plug 3, i.e., a voltage such that the center electrode 3a is at a higher potential than the ground electrode 3b. If a negative voltage is applied to the electrodes, the ionic current between the electrodes 3a and 3b is due to the flow of positive ions. Since positive ions have a large mass, the ionic current is extremely small, and the current flowing through the resistor 5 is difficult to measure. In contrast, when a positive voltage is applied between the center electrode 3a and the ground electrode 3b, the ionic current is caused by the flow of electrons. As electrons have a much smaller mass than positive ions, the ionic current is much larger (generally 10–50 times as high) than an ionic current due to positive ions. Therefore, when a positive voltage is applied across the electrodes 3a and 3b, a large current flows through the resistor 5, producing an easily detectable change in the voltage at the terminal 6.

The capacitor 4 takes the place of a DC power supply having a DC-DC converter such as is required in a conventional ionic current sensing apparatus. The capacitor 4 can be much smaller, lighter, and cheaper than a DC power supply, so an ionic current sensing apparatus according to the present invention can be smaller, lighter, and cheaper than a conventional one.

Figure 4:
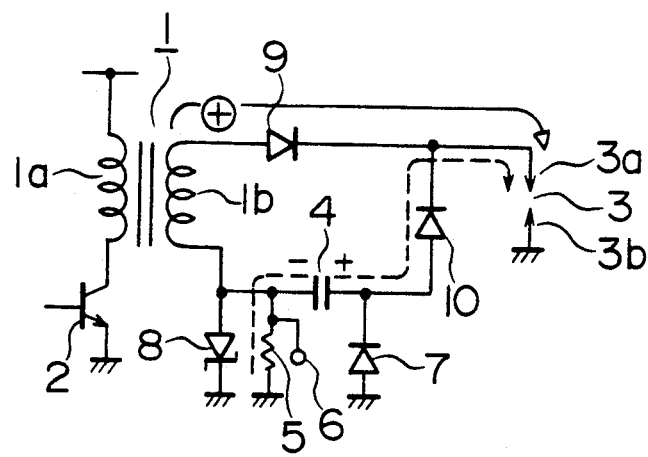
FIG. 4 i a circuit diagram of a second embodiment of an ionic current sensing apparatus according to the present invention.

In the embodiment of FIGS. 1–3, the ignition coil 1 was configured so as to apply a negative voltage to a spark plug 3 to produce ignition. FIG. 4 illustrates a second embodiment of the present invention having an ignition coil which is configured so as to apply a positive voltage to the center electrode of a spark plug to produce ignition. Like the embodiment of FIG. 1, this embodiment has an ignition coil 1 with a primary winding 1a and a secondary winding 1b. One end of the primary winding 1a is connected to an unillustrated power supply such as a battery, and the other end of the primary winding 1b is connected to a power transistor 2. The secondary winding 1b has a positive end and a negative end. The positive end is connected to the center electrode 3a of a spark plug 3 through a diode 9 having its anode connected to the secondary winding 1b and its cathode connected to the spark plug 3. The negative end of the secondary winding 1b is connected to one terminal of a capacitor 4, to one end of a current sensing resistor 5, and to the anode of a Zener diode B. The other terminal of the capacitor 4 is connected to the cathode of a diode 7 and to the anode of another diode 10. The cathode of the Zener diode 8, the other end of the current sensing resistor 5, and the anode of diode 7 are connected to ground. The cathode of diode 10 is connected to the cathode of diode 9 and to the center electrode 3a of the spark plug 3. A terminal 6 is connected to the junction of the resistor 5 and the capacitor 4 to enable measurement of the change in the voltage across the resistor 5 caused by ionic current.

The operation of this embodiment is similar to that of the previous embodiment. When the power transistor 2 is switched off to cut off the primary current flowing through the primary winding 1a, a high voltage of the illustrated polarity is generated in the secondary winding 1b, and a discharge current flows from the secondary winding 1b through diode 9 and into the spark plug 3 as shown by the solid arrow. At the same time, the capacitor 4 is charged with the illustrated polarity to a voltage, such as 300 volts, determined by the Zener diode 8.

Discharge of the spark plug 3 produces ionization of the fuel-air mixture, and ions are generated between the electrodes of the spark plug 3. The positive voltage applied to the spark plug 3 by the capacitor 4 causes an ionic current to flow between the electrodes of the spark plug 3. The ionic current allows the capacitor 4 to discharge, and an electric current flows in the direction shown by the dashed arrow in FIG. 4 through the resistor 5, the capacitor 4, and diode 10. This electric current produces a change in the voltage at the terminal 6 corresponding to the magnitude of the ionic current. As in the previous embodiment, the ionic current between the electrodes of the spark plug 3 is due to the flow of electrons, so the magnitude of the ionic current is large and can be easily measured by the change in the voltage at the terminal 6. This embodiment provides the same advantages as the previous embodiment.

Figure 5:
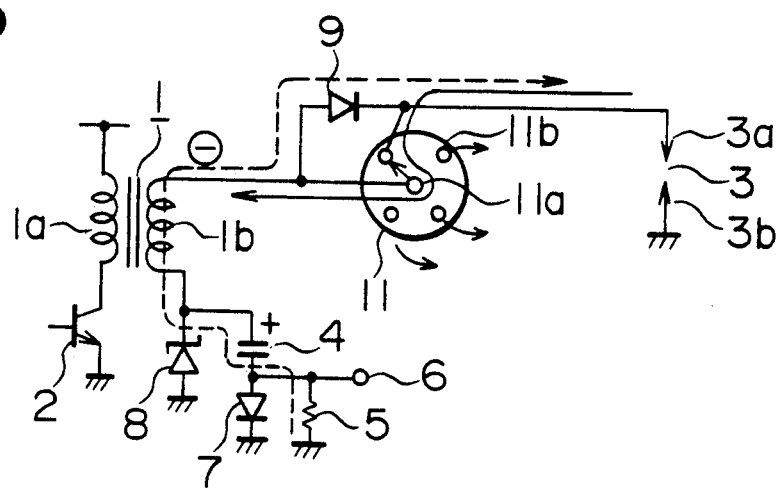
FIG. 5 and FIG. 6 are circuit diagrams of a third and a fourth embodiment of the present invention applied to ignition systems equipped with a distributor.

In the preceding embodiments, an ignition coil is connected directly to a spark plug. However, the present invention can also be applied to an ignition system equipped with a distributor. FIG. 5 illustrates a third embodiment of the present invention in which a single ignition coil 1 provides an ignition voltage for a plurality of spark plugs (only one of which is shown) via a distributor 11. As in the preceding embodiments, the ignition coil 1 has a primary winding 1a and a secondary winding 1b. One end of the primary winding 1a is connected to an unillustrated power supply, and the other end of the primary winding 1b is connected to a power transistor 2. The distributor 11 has a center electrode 11a that rotates in synchrony with the engine (normally at half the rotational speed of the engine) and a plurality of stationary peripheral electrodes 11b disposed around the center electrode 11a. The center electrode 11a is connected to the negative end of the secondary winding 1b, and each of the peripheral electrodes 11b is connected to the center electrode 3a of one of the spark plugs 3 of the engine, only one of which is shown. Each of the peripheral electrodes 11b is also connected to the center electrode 11a by a diode 9 (only one of which is shown) having its anode connected to the center electrode 11a and its cathode connected to one of the peripheral electrodes 11b.

The positive end of the secondary winding 1b is connected to one terminal of a capacitor 4 and to the cathode of a Zener diode 8. The other terminal of the capacitor 4 is connected to one end of a current sensing resistor 5 and to the anode of a diode 7. The other end of the resistor 5 and the cathode of diode 7 are grounded. A terminal 6 is connected to the junction of the resistor 5 and the capacitor 4 to enable measurement of the change in voltage across the resistor 5 caused by ionic current. This embodiment is similar in structure to the embodiment of FIG. 1 except that the distributor 11 and the diodes 9 are connected between the spark plug 3 and the negative end of the secondary winding 1b.

When the center electrode 11a of the distributor 11 contacts one of the peripheral electrodes 11b and the power transistor 2 is cut off, a discharge current flows in the direction shown by the solid arrow in FIG. 5 and the spark plug 3 is discharged to ignite the air-fuel mixture in one of the cylinders. At the same time, the capacitor 4 is charged with the illustrated polarity. Then, the positive voltage applied by the capacitor 4 between electrodes 3a and 3b of the spark plug 3 produces an ionic current between the electrodes, and due to the ionic current, an electric current flows in the direction shown by the dashed arrow in FIG. 5 through the resistor 5, the capacitor 4, the secondary winding 1b, and the diode 9. This current produces a change in the voltage at the terminal 6, which can be monitored to determine whether the cylinder is firing. As the center electrode 11a rotates and successively contacts each of the peripheral electrodes 11b, the above process is repeated for each cylinder, and the ionic current generated in each of the cylinders can be determined based on the voltage at the terminal 6. This embodiment employs a capacitor 4 to generate an ionic current, so it provides the same advantages as the previous embodiments.

Figure 6:
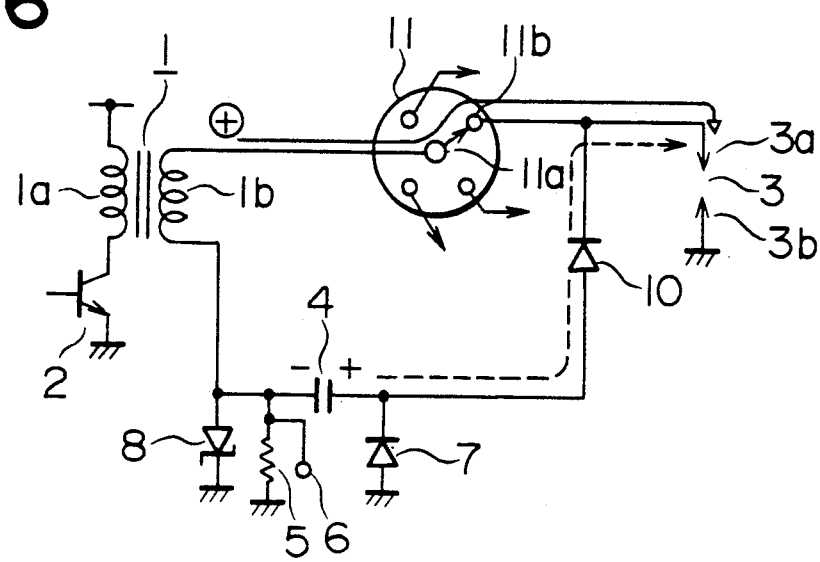

FIG. 6 illustrates another embodiment of the present invention. This embodiment is similar to the embodiment of FIG. 4, but diode 9 of FIG. 4 has been replaced by a distributor 11 having a center electrode 11a and a plurality of peripheral electrodes 11b. The center electrode 11a is connected to the positive end of the secondary winding 1b of an ignition coil 1, and each of the peripheral electrodes 11b is connected to the center electrode 3a of one of a plurality of spark plugs 3, only one of which is shown. A capacitor 4, a current sensing resistor 5, a diode 7, and a Zener diode 8 are connected to the negative end of the secondary winding 1b in the same manner as in the embodiment of FIG. 4. The capacitor 4 is connected with each of the peripheral electrodes 11b of the distributor 11 through one of more diodes 10, each having its anode connected to the capacitor 4 and its cathode connected to the distributor 11. A single diode 10 can be connected to each of the peripheral electrodes 11b, or a separate diode 10 can be provided for each peripheral electrode 11b.

When the power transistor 2 is turned off, an ignition current flows through the distributor 11 to one of the spark plugs 3 in the direction shown by the solid arrow in FIG. 6, and the capacitor 4 is charged with the illustrated polarity. Then, the capacitor 4 applies a positive voltage between the electrodes of the spark plug 3 to produce an ionic current, and due to the ionic current, an electric current flows through the resistor 5, the capacitor 4, and diode 10 as shown by the dashed arrow. This current produces a change in the voltage at the terminal corresponding to the ionic current, and by monitoring this voltage, it can be ascertained whether the cylinder is firing properly. This process is repeated in succession for each cylinder of the engine. Like the previous embodiments, this embodiment employs a capacitor 4 to apply a voltage for generating an ionic current, so it provides the same advantages as those embodiments.

Figure 7:
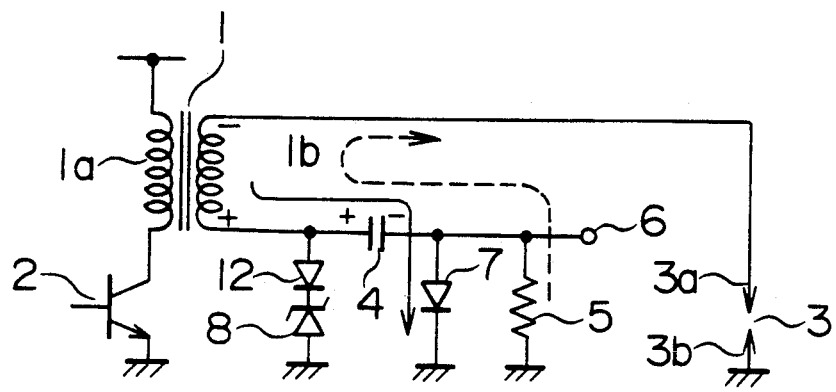
FIG. 7 is a circuit diagram of a fifth embodiment of an ionic current sensing apparatus according to the present invention.

FIG. 7 illustrates another embodiment of the present invention. This embodiment differs from the embodiment of FIG. 1 only in that a diode 12 is inserted between the positive end of the secondary winding 1b and the Zener diode 8 with its anode connected to the secondary winding 1b and its cathode connected to the cathode of the Zener diode 8. The solid arrow indicates the direction of current when the spark plug 3 is firing, while the dashed arrow indicates the direction of current through the resistor 5, the capacitor 4, and the secondary winding 1b when ionic current is generated between the electrodes 3a and 3b of the spark plug 3. The operation of this embodiment is essentially the same as that of the embodiment of FIG. 1 and provides the same advantages.

Figure 8:
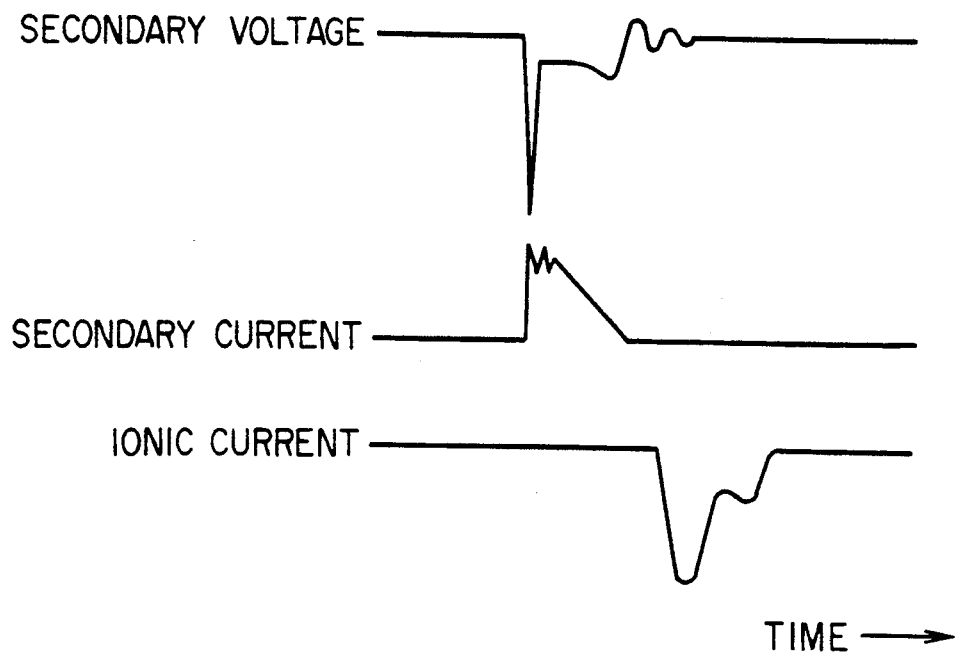
FIG. 8 is a graph of the secondary voltage, the secondary current, and the ionic current as a function of time during the operation of the embodiment of FIG. 7.

FIG. 8 illustrates the voltage in the secondary winding 1b, the secondary current when the spark plug 3 fires, and the ionic current that flows between the electrodes of the spark plug 3 as a function of time during the operation of the embodiment of FIG. 7.

Figure 9:
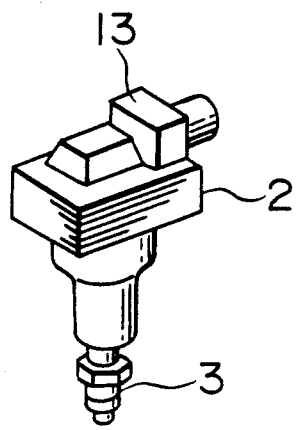
FIG. 9 is a perspective view of a spark plug combined with a power transistor and an ionic current sensing unit.

The capacitor 4, the current sensing resistor 5, diodes 7 and 12, and the Zener diode 8 are all very compact, so as shown in FIG. 9, it is possible to combine them into a single current sensing unit 13 small enough to be mounted on a spark plug 3 together with the power transistor 2. The spark plug 3, the power transistor 2, and the current sensing unit 13 can be made integral with one another so as to enable their being installed on an engine as a single member. This arrangement not only reduces the size and weight of an ionic current sensing apparatus, but it reduces the length of wiring which is required for connecting the various components.

Figure 10:
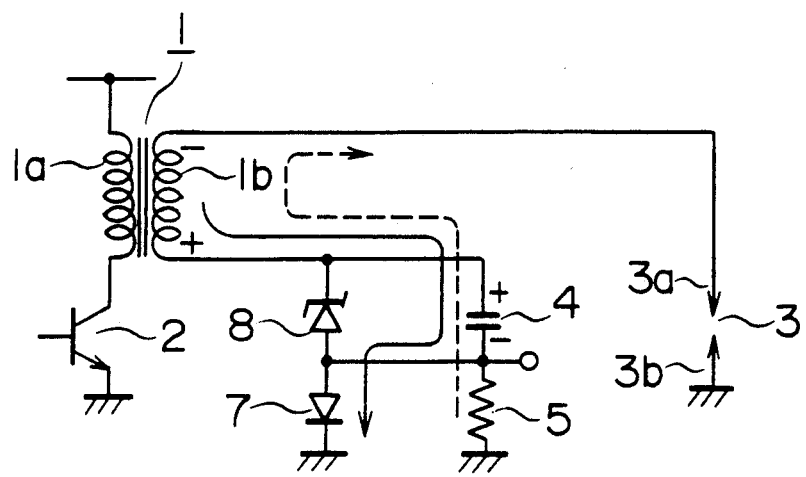
FIG. 10 is a circuit diagram of a sixth embodiment of an ionic current sensing apparatus according to the present invention.

The embodiment of FIG. 7 employs two diodes 7 and 12. FIG. 10 illustrates another embodiment of the present invention in which a single diode 7 performs the function of both of diodes 7 and 12 of the embodiment of FIG. 7. This embodiment is similar to the embodiment of FIG. 7 except that diode 12 is omitted, and the cathode of the Zener diode 8 is connected to the positive end of the secondary winding 1b, while its anode is connected to the anode of diode 7 instead of to ground. The operation of this embodiment is essentially the same as that of the embodiment of FIG. 7. The solid arrow indicates the direction of current when the spark plug 3 is firing, and the dashed arrow indicates the direction of current through the resistor 5, the capacitor 4, and the secondary winding 1b when ionic current is flowing between the electrodes of the spark plug 3. This arrangement permits a further decrease in the size and weight of the apparatus.

Figure 11:
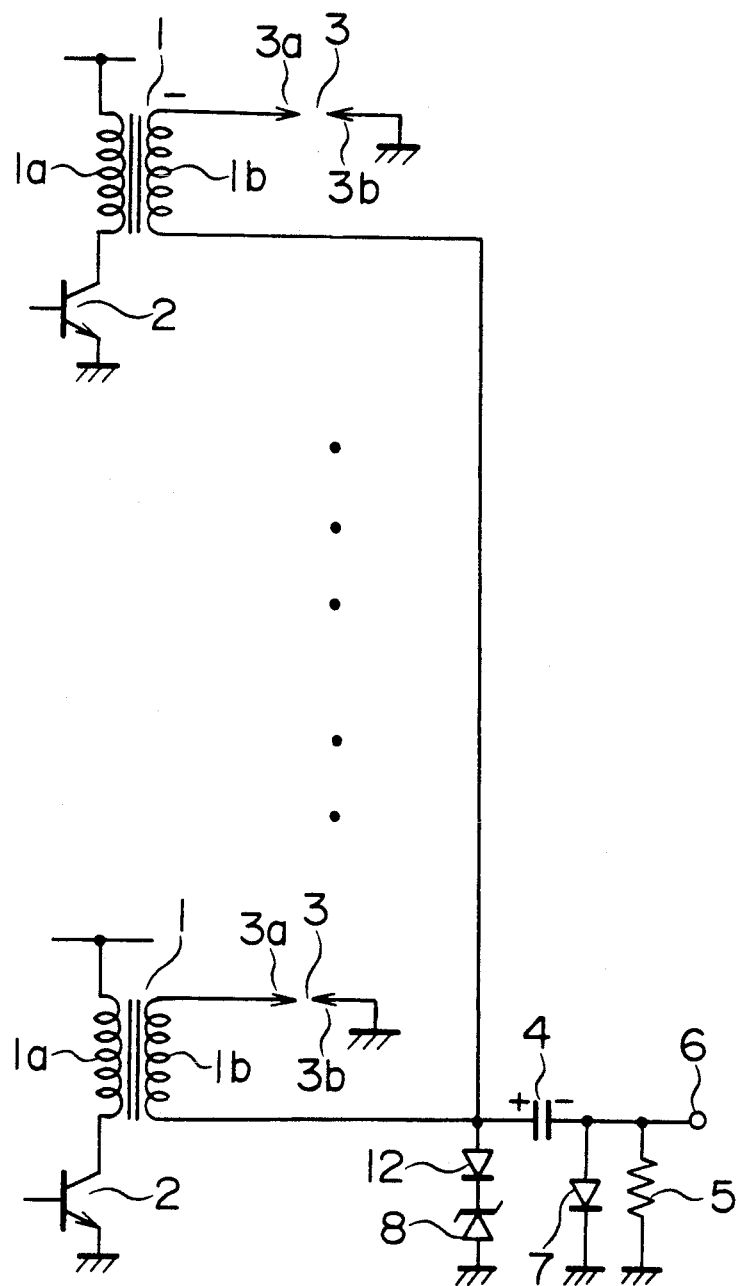
FIG. 11 is a circuit diagram illustrating how the embodiment of FIG. 10 can be used to sense the ionic current in a plurality of spark plugs.
Figure 12:
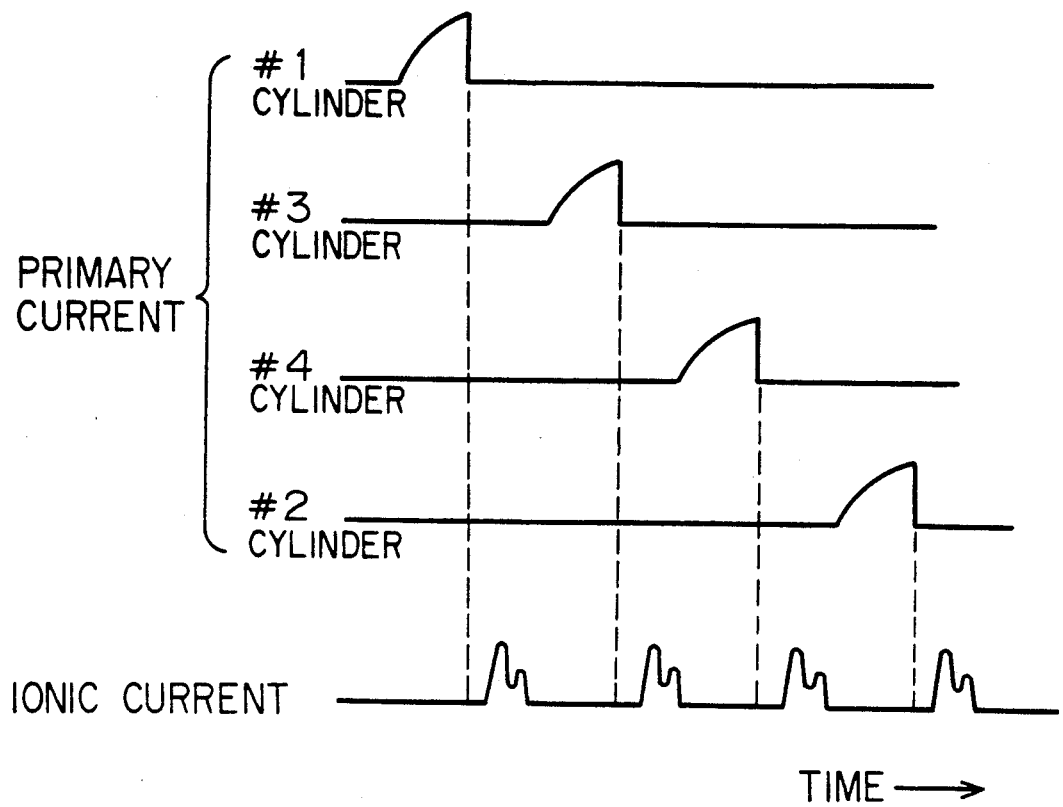
FIG. 12 is a wave form diagram showing the primary current flowing through each of the ignition coils and the ionic current flowing through each of the spark plugs of a four-cylinder engine equipped with the arrangement of FIG. 11.

A separate circuit comprising a capacitor 4, a resistor 5, a diode 7, a Zener diode 8, and optionally a diode 12 can be provided for each cylinder of the engine. Alternatively, as shown in FIG. 11, a single such circuit can be used to detect ionic current in all the cylinders. In FIG. 11, each cylinder of an engine is equipped with a separate ignition coil 1 having a secondary winding 1b connected to the center electrode 3a of a corresponding spark plug 3. The junction of diode 12 and capacitor 4 is connected to the secondary winding 1b of each ignition coil 1. Whenever one of the spark plugs 3 fires, the capacitor 4 is charged with the illustrated polarity. The capacitor 4 then applies a positive voltage between the electrodes 3a and 3b of each of the spark plugs 3. However, since only one of the cylinders is in its combustion stroke at a given time, an ionic current will be generated between the electrodes of only the spark plug 3 for the cylinder in its combustion stroke. FIG. 12 illustrates the primary current flowing through the primary winding 1a of each of four ignition coils 1 for a four-cylinder engine and the ionic current which is sensed. Since it can be easily determined which cylinder of the engine is in its combustion stroke at any given time, it can be determined to which cylinder the measured ionic current corresponds. Therefore, it can be ascertained if any of the cylinders is misfiring.

Figure 13:
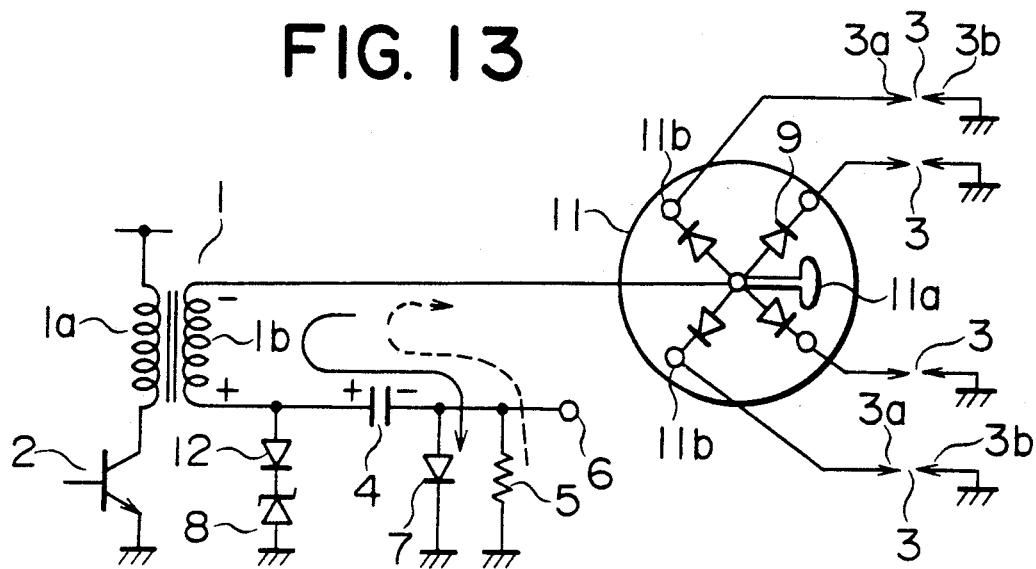
FIG. 13 is a circuit diagram of a seventh embodiment of the present invention applied to an ignition system with a distributor.

FIG. 13 illustrates another embodiment of the present invention. This embodiment is identical to the embodiment of FIG. 5 except that a diode 12 is inserted between the Zener diode 8 and the positive end of the secondary winding 1b. The anode of diode 12 is connected to the secondary winding 1b and to the capacitor 4, while its cathode is connected to the cathode of the Zener diode 8. Each of the peripheral electrodes 11b of the distributor 11 is connected to the center electrode 3a of one of a plurality of spark plugs 3, and the center electrode 11a of the distributor 11 is connected to each of the peripheral electrodes 11b by corresponding diodes 9 having their anodes connected to the center electrode 11a and their cathodes connected to the peripheral electrodes 11b. The solid arrow shows the direction of current when one of the spark plugs 3 is firing, and the dashed arrow shows the direction of current when an ionic current is flowing between the electrodes of one of the spark plugs. The operation of this embodiment is essentially the same as that of the embodiment of FIG. 5 and provides the same advantages.

Although in the above-described embodiments, an engine to which the present invention is applied is illustrated as having four cylinders, the number of cylinders is arbitrary, and the present invention can be applied to any spark ignited engine having one or more cylinders.

In the illustrated embodiments, a current sensing resistor 5 is used to sense electric current caused by an ionic current in a cylinder, but other current sensing devices can instead by used.

What is claimed is:

1. An ionic current sensing apparatus for an internal combustion engine, comprising:
   a) a spark plug mounted in a cylinder of the engine, and having a first electrode (3a) and a grounded second electrode (3b);
   b) a capacitor (4);
   c) circuit means connecting the capacitor to the first spark plug electrode;
   d) charging means for charging the capacitor with a polarity such that the capacitor applies a positive voltage between the first and the second spark plug electrodes;
   e) current sensing means for sensing ionic current flowing between the capacitor and the first spark plug electrode following combustion in the engine cylinder, said current sensing means comprising a resistor (5) connected between the capacitor and ground such that ionic current flows through the resistor when the capacitor discharges; and
   f) a first rectifying element (7) connected to the capacitor in parallel with the current sensing resistor.

2. An apparatus as claimed in claim 1 wherein the charging means comprises an ignition coil having a primary winding and a secondary winding (1b), the secondary winding having a first end connected to the first spark plug electrode and a second end connected to the capacitor.

3. An apparatus as claimed in claim 2 wherein the charging means further comprises a Zener diode (8) connected to the second end of the secondary winding in parallel with the capacitor.

4. An apparatus as claimed in claim 3 further comprising a second rectifying element (12) connected in series with the Zener diode.

5. An apparatus as claimed in claim 4 wherein:
   the Zener diode, the second rectifying element, the capacitor, and the current sensing resistor form a bridge circuit connected between the second end of the secondary winding and ground.

6. An apparatus as claimed in claim 1 comprising a plurality of spark plugs, each of which is electrically connected to the capacitor.

7. An apparatus as claimed in claim 6 comprising a plurality of ignition coils, each of which has a primary winding and a secondary winding, each of the secondary windings having a first end connected to one of the spark plugs and a second end connected to the capacitor.

8. An apparatus as claimed in claim 2 further comprising a distributor (11) having a rotating center electrode (11a) connected to the first end of the secondary winding and a peripheral electrode (11b) connected to the first electrode of the spark plug.

9. An apparatus as claimed in claim 2 wherein the capacitor has a first terminal connected to the second end of the secondary winding and a second terminal, and the current sensing resistor is connected between the first terminal and ground, the apparatus further comprising:

a third rectifying element (10) connected between the second terminal of the capacitor and the first electrode of the spark plug; and a fourth rectifying element (9) connected between the first end of the secondary winding and the first electrode of the spark plug.

10. An apparatus as claimed in claim 8 further comprising a rectifier (10) connected between the capacitor and the first electrode of the spark plug.

11. An apparatus as claimed in claim 8 further comprising a rectifier (9) connected between the center electrode of the distributor and the peripheral electrode.

* * * * *